(12) United States Patent
Winger et al.

(10) Patent No.: US 9,746,527 B2
(45) Date of Patent: Aug. 29, 2017

(54) METHOD AND APPARATUS FOR BATTERY CHARGE LEVEL ESTIMATION

(75) Inventors: Lyall Kenneth Winger, Waterloo (CA);
David Gerard Rich, Waterloo (CA);
Rene Pierre Marchand, Waterloo (CA)

(73) Assignee: BlackBerry Limited, Waterloo (CA)

( * ) Notice: Subject to any disclaimer, the term of this patent is extended or adjusted under 35 U.S.C. 154(b) by 1632 days.

(21) Appl. No.: 13/300,843

(22) Filed: Nov. 21, 2011

(65) Prior Publication Data
US 2013/0132010 A1    May 23, 2013

(51) Int. Cl.
*G01R 31/36* (2006.01)
*H02J 7/00* (2006.01)

(52) U.S. Cl.
CPC ..... *G01R 31/3679* (2013.01); *G01R 31/3606* (2013.01); *G01R 31/3648* (2013.01); *H02J 7/00* (2013.01)

(58) Field of Classification Search
CPC   G01R 31/3648; G01R 31/3606; G01R 31/36; G01R 31/3679; G01R 31/3617; G06F 17/50; G06F 17/5009; G06F 17/5036; H02J 7/00
See application file for complete search history.

(56) References Cited

U.S. PATENT DOCUMENTS

| | | | |
|---|---|---|---|
| 4,377,787 A * | 3/1983 | Kikuoka | G01R 31/3613 324/426 |
| 5,372,898 A | 12/1994 | Atwater et al. | |
| 6,369,576 B1 * | 4/2002 | Matthews | G01R 19/0092 320/106 |
| 7,105,982 B1 | 9/2006 | Hagood, IV et al. | |
| 2005/0017602 A1 | 1/2005 | Arms et al. | |
| 2008/0278115 A1 * | 11/2008 | Huggins | B60L 3/12 320/134 |
| 2009/0309538 A1 * | 12/2009 | Xu | H01M 10/441 320/101 |

(Continued)

FOREIGN PATENT DOCUMENTS

| EP | 1736789 | 12/2006 |
|---|---|---|
| WO | 2008061116 | 5/2008 |

OTHER PUBLICATIONS

Office Action issued on Apr. 26, 2016 on corresponding European Patent Application No. 11190020.5.

(Continued)

*Primary Examiner* — Sujoy Kundu
*Assistant Examiner* — L. Anderson
(74) *Attorney, Agent, or Firm* — Borden Ladner Gervais LLP; Todd Keeler

(57) ABSTRACT

There is provided an apparatus for battery life estimation comprising an energy harvester; an energy storage apparatus, connected to the energy harvester, the energy storage apparatus representative of a unit of measure; a battery for receiving energy from the storage apparatus; and a processor for monitoring the energy provided by the storage apparatus, monitoring energy provided to the battery by other charging apparatus and monitoring the energy being delivered by the battery; wherein the processor calculates the remaining life of the battery based on the number of energy storage apparatus units that are provided to and delivered from the battery.

15 Claims, 4 Drawing Sheets

(56) References Cited

U.S. PATENT DOCUMENTS

| | | | | |
|---|---|---|---|---|
| 2010/0270996 A1* | 10/2010 | Ramadas | ................ | H02M 1/36 |
| | | | | 323/311 |
| 2011/0032732 A1* | 2/2011 | Hsu | ................... | H02M 3/33561 |
| | | | | 363/21.14 |
| 2013/0099724 A1* | 4/2013 | Rich | ........................ | H02J 7/00 |
| | | | | 320/106 |

OTHER PUBLICATIONS

Siebert et al., "Self-timed circuits for energy harvesting AC power supplies", Low Power Electronics and Design, 2005. ISLPED '05. Proceedings of the 2005 International Symposium, Issue Date: Oct. 24, 2005, pp. 315-318, ISBN 1-59593-137-6.

European Patent Office, Extended European Search Report for EP Patent App. No. 11190020.5, Jun. 18, 2012.

\* cited by examiner

METHOD AND APPARATUS FOR BATTERY CHARGE LEVEL ESTIMATION

FIELD OF THE DISCLOSURE

The present disclosure relates generally to portable electronic devices. More particularly, the present disclosure relates to a method and apparatus for battery charge level estimation.

BACKGROUND OF THE DISCLOSURE

The use of portable electronic devices—such as but not limited to mobile communication devices (such as cellular phones or a smart phones), music players, remote controls, electronic navigation devices (such as Global Positioning System devices), portable DVD players, a portable digital assistants (PDAs) and portable computers (such as tablet computers or laptop computers)—has become widespread. Many portable electronic devices are handheld, that is, sized and shaped to be held or carried in a human hand. These devices often include or are often powered by one or more rechargeable batteries.

When the power level of the battery is depleted, the device is generally inoperable and the battery may require recharging before the device becomes operable. In order to avoid this situation, some current devices provide an indicator indicating power remaining in the battery, however, these indicators only provide approximate information relating to the remaining life of the battery. For instance, some devices provide an indication of battery life in 25% segments while others provide in other increments with margins of error such as +/−10%. Some indications of battery life are inaccurate in that they may not fairly and accurately reflect how much power is left in the battery and whether or not the device can perform certain functions (as some functions may require more power than others).

BRIEF DESCRIPTION OF THE DRAWINGS

Embodiments of the present invention will now be described, by way of example only, with reference to the attached Figures, wherein.

DETAILED DESCRIPTION

The current disclosure is directed at a novel method and apparatus for battery charge level estimation which provides more accurate information to the user. With a more accurate understanding of the remaining battery life, the user may be able to more clearly determine which functionalities should be used and which should not be in order to not drain the battery, especially when the battery is almost drained. This can also assist the user in emergency situations when the user needs to make a call.

The method and apparatus includes the introduction of a novel counting method or unit of measure which is common for different methods of charging or discharging a battery. Therefore, the power supplied by an external charging apparatus or by a secondary charging apparatus can be calculable with respect to this novel counting method, or unit of measure, to provide a more accurate representation of the remaining battery life to the user.

In general, this disclosure is directed to novel methods and apparatus for battery charge level estimation. The methods and apparatus may introduce a new unit of measure with respect to determining the remaining power level in a battery. (Although power and energy are distinct concepts, they may be related to one another; and for purposes of the discussion, the distinction between power and energy will not be emphasized, and either term may be used in explanation. Further, power and energy may be related to other common electrical quantities, such as voltage, current, capacitance, and so forth.) One prospective advantage is that the methods may be more effective for determining the charge level of batteries with a flat voltage charge or discharge curve or batteries with multiple peaks (e.g., silver-zinc), where the history of the battery's charge or discharge is known. Another potential advantage of the methods and apparatus is that it may be more efficient than other battery level monitoring systems for devices that have a secondary power source having a low-power output.

Figure 1:
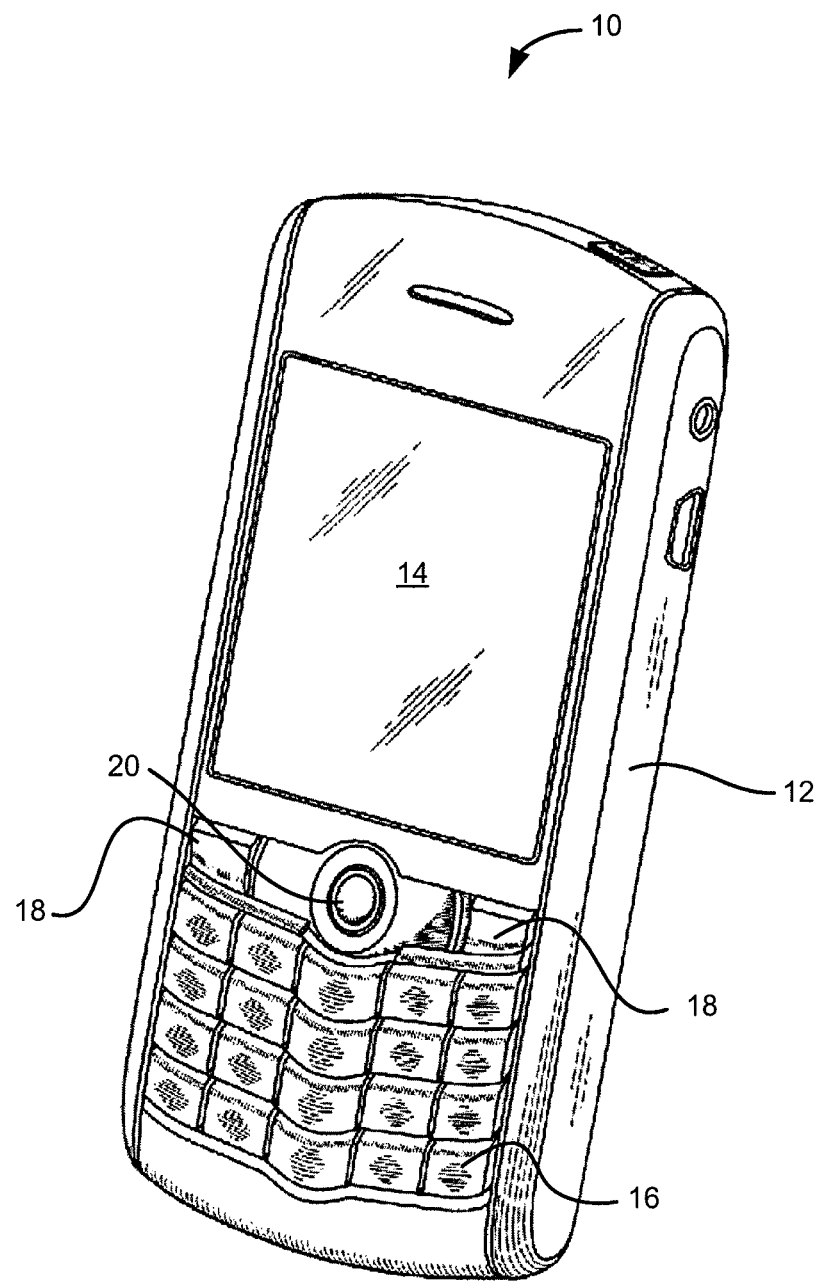
FIG. 1 is a perspective view of an illustrative portable electronic device.

Turning to FIG. 1, a perspective diagram of a typical portable electronic device is shown. The portable electronic device, such as a mobile communication device 10, has a body 12, a display screen 14 (which may be a touch screen capable of receiving input and displaying output), a keyboard/keypad 16, a set of buttons 18 and a trackball 20. Trackball 20 is an example of an input device; other examples may be a joystick, scroll wheel, roller wheel, touchpad or the like, or another button. The device 10 may include other parts which are not shown or described. For example, the device 10 may include one or more processors (not shown) that control the various functions of the device. Many of the components of the device 10 may be powered by electrical power, and the electrical power may be stored in a power pack (not shown) that may include one or more rechargeable batteries. As the device 10 performs various functions (such as sending or receiving wireless messages, or displaying information on the display screen 14), power stored in a battery may be consumed. In some portable electronic devices, an indicator may be displayed (e.g., on the display screen 14), the indicator indicating the approximate power or energy remaining in the battery or the approximate remaining battery life (that is, a measure of practical usefulness) of the battery. Such battery life estimation indicators may resemble, for example, fuel gauges.

Figure 2:
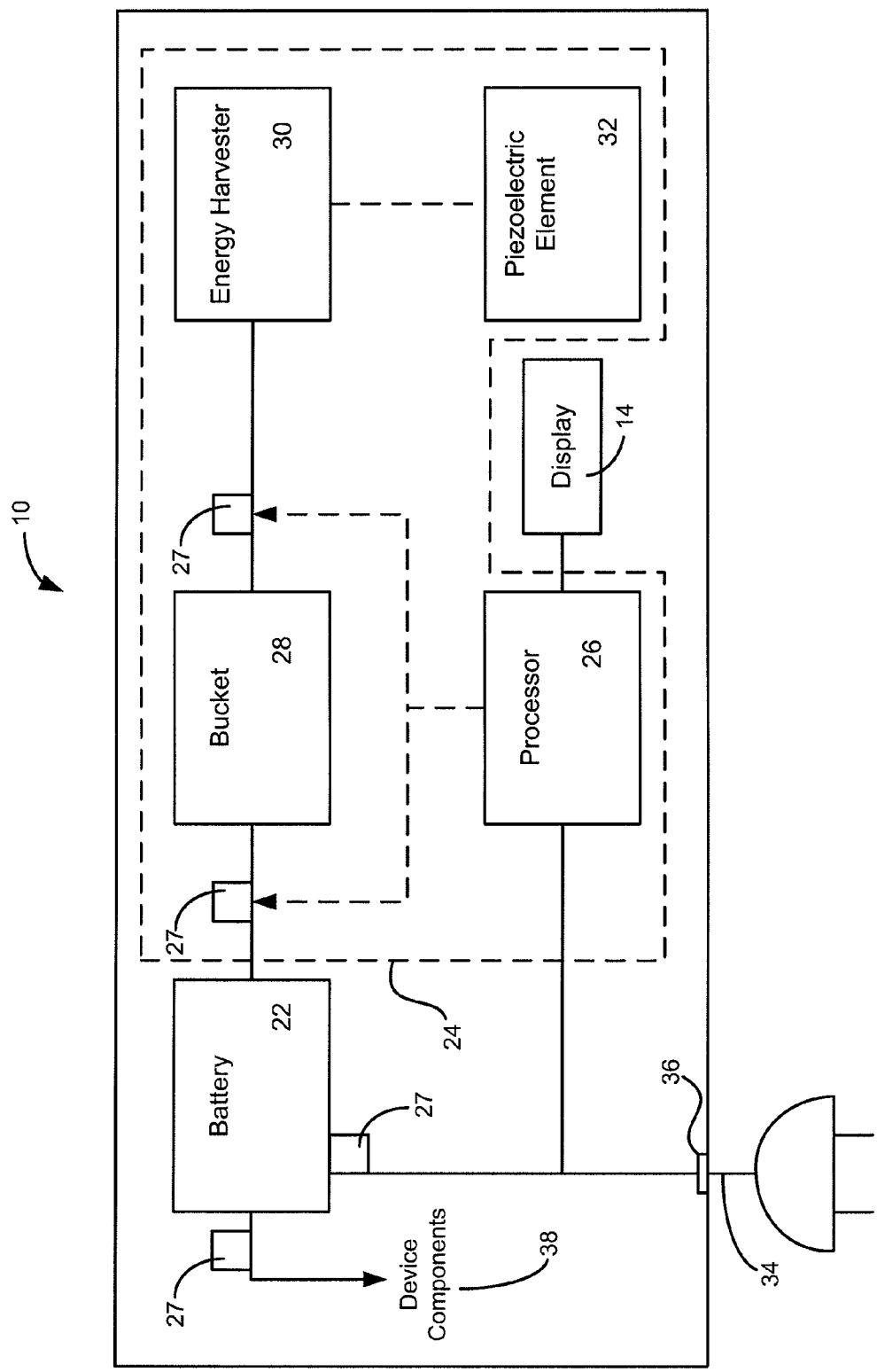
FIG. 2 is a schematic diagram of apparatus for battery life estimation.

Turning to FIG. 2, a schematic diagram of a system for monitoring or estimating the remaining life of a battery within a portable electronic device is shown. Within the portable electronic device 10 is a battery 22 which provides power to device components 38 within the device 10. (Device components 38 can be any component or set of components in the portable electronic device that consume power or power consuming components. Although depicted as a separate entity in FIG. 2, the device components 38 may include other components explicitly shown in FIG. 2, such as the display 14 or the processor 26), In one embodiment, the battery 22 is a rechargeable battery such as, but not limited to, a nickel cadmium, nickel metal hydride or lithium ion type battery. The system 24 for monitoring or estimating the remaining life of the battery 22 includes a processor 26 which is configured to monitor the amount of power, or energy, that is being delivered by or supplied to the battery via a set of sensors 27, which may be located at various locations within the device 10. The processor 26 can also be used for other device functionality (the processor 26 may be, but need not be, a processor that controls the various functions of the device 10, for example) and does not have to be solely for use in the system 24. The processor 26 is further electrically connected to the display screen 14 for transmitting information relating to the power level of the battery 22 to the user such as in the form of a battery life indicator. In general, and as indicated by context, components are electrically connected when an electrical signal in one affects the other. Components that are electrically connected may be physically connected as well. Electrical connection does not necessarily mean that components are directly electrically connected; they may be connected via one or more intermediate elements.

An energy storage apparatus 28, which for purposes of explanation may be called a "bucket", is electrically connected to at least one energy harvester 30. The energy harvester 30 may generate energy, for consumption or for storage or both. The bucket 28 may be an electronic element or combination of electronic elements that can store and supply electrical energy relatively quickly, such as a capacitor or a bank of capacitors. As will be described below, the bucket 28 can be used to represent a novel unit of measure with respect to determining the remaining power level in the battery 22.

The energy harvester 30 harvests energy, that is, the energy harvester is configured to convert energy in one non-electrical form (such as light, electromagnetic waves, mechanical motion) into electrical energy that can be stored or consumed. In one embodiment selected for purposes of illustration, the energy harvester 30 can be a piezoelectric element 32. The piezoelectric element 32 is capable of generating electrical potential in response to applied mechanical stress such as the shaking or movement of the device 10 such that any movement of the device results in electrical energy being generated. Alternatively, multiple piezoelectric elements can be connected to the bucket 28, or energy harvester 30, to generate a larger amount of electrical energy based on a single mechanical stress applied to the device 10.

The battery 22 may also be charged via an external cord 34 that may be plugged into a port 36 on the device 10 (such as a USB port) at one end and a wall outlet at the other end.

In one embodiment, one or more sensors 27 are located at various sites. The sensors 27 may generate a signal as a function of current or voltage or transfer of energy or power (or other quantity that may be a function of energy or power), and may supply that signal to a processor such as the processor 26. A sensor 27 may be located proximate to the output of the battery 22, for example, and may sense the power or energy being supplied by the battery to be consumed by one or more device components 38. A sensor 27 may be located at an input to the battery 22, which is being supplied power from the external power source via the cord 34, and a sensor 27 may be located between the bucket 28 and the battery 22 to determine how much power or energy is supplied from the bucket 28 to the battery 22. An optional sensor 27 may also be placed between the energy harvester 30 and the bucket 28 to determine how much power or energy has been supplied to the bucket. The sensors 27 can be, for example, coulomb counters or any other power management integrated circuit (PMIC) gauge. Use of another sensor within the bucket 28 may assist the processor 26 in determining when the bucket 28 is full (of energy) so that it can be "dumped" into, or supplied to, the battery.

The sensor 27 located between the bucket 28 and the battery 22 can also be replaced or supplemented by a counter that monitors whenever the contents of the bucket 28—that is, the energy stored in the bucket 28—is "dumped" into, or supplied to, the battery 22. In general, "dumping" comprises activating one or more switches (such as electronic switches or transistors, under the control of another element such as the processor 26) that control the electrical connection between the bucket 28 and the battery 22 and that cause energy stored in the bucket 28 to be transferred to the battery 22. Such a counter may be useful in trying to "dump" buckets 28 that are full (the concept of "full" meaning substantially full, not necessarily completely full). In some implementations, the bucket may be deemed full when it reaches a particular level (such as a selected or otherwise identified threshold voltage between plates of a capacitor, the energy stored in a capacitor being a function of the voltage). Dumping buckets that are full may be more efficient than dumping buckets that are not full (and may also simplify power accounting, as described below). If a counter is used, a signal may be transmitted to the processor 26 each time a bucket is dumped. As will be discussed below, the use of the bucket 28 can provides a novel unit of measure for measuring the amount of power remaining in a battery.

Figure 3:
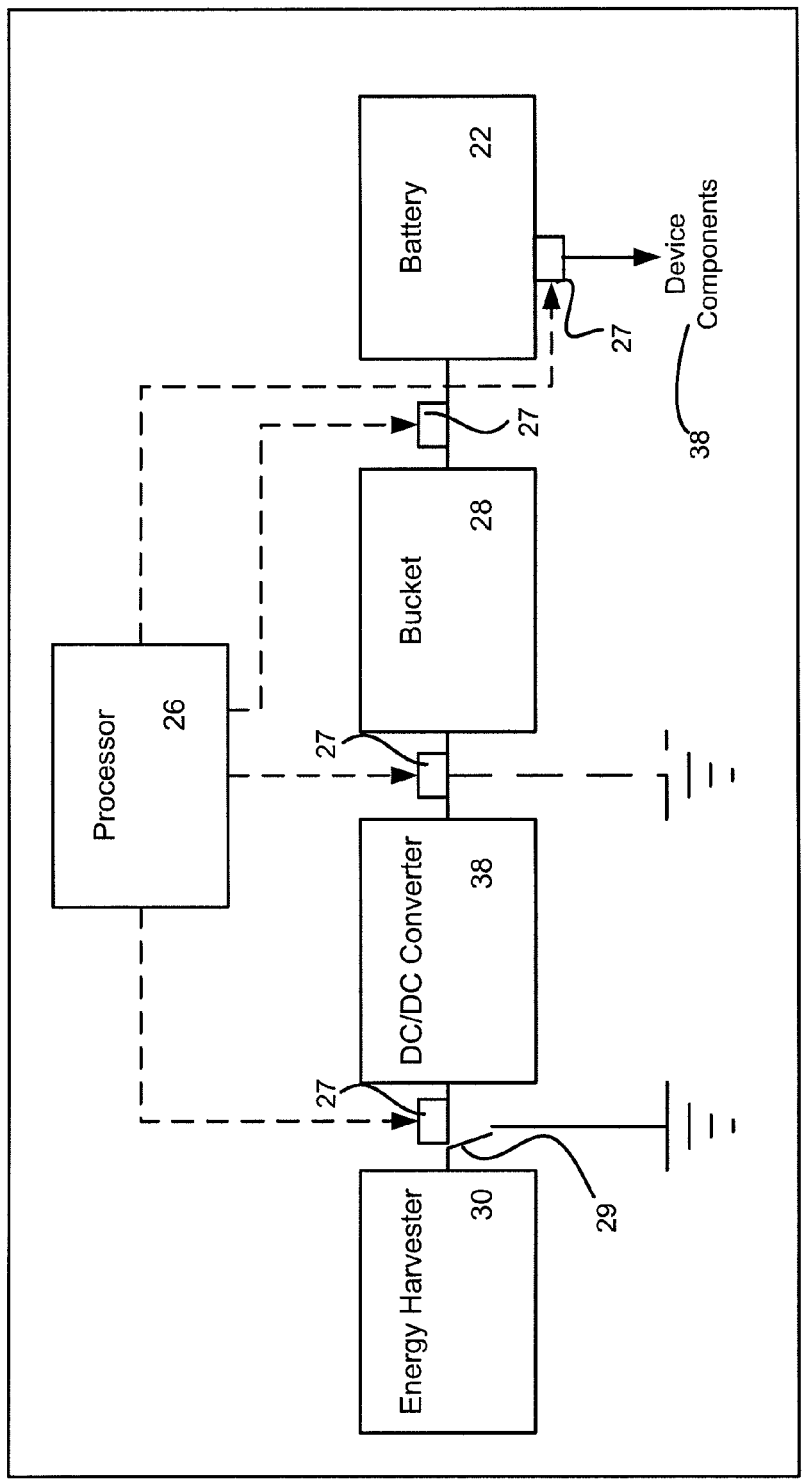
FIG. 3 is a schematic diagram of an alternative embodiment of apparatus for battery life estimation.

In an alternative embodiment, as shown in FIG. 3, the connection between the energy harvester 30, the bucket 28 and the battery 22 can further include other components. In this embodiment, a DC/DC converter 38 (such as a switched buck, boost or buck-boost converter) is electrically connected to an output of the energy harvester 30 to assist in regulating the power (such as by controlling magnitude and rate of change of voltage) that is being supplied to the bucket 28, and subsequently to the battery 22. The DC/DC converter 38 may also be connected between the piezoelectric element 32 and the bucket 28 in the absence of the energy harvester 30. The system of the current embodiment includes the processor 26 and the plurality of sensors 27 which function as discussed above.

A switch 29 may be located between the energy harvester 30 and the DC/DC converter 38 and be in communication with (or otherwise under the control of) the processor 26 to selectively open and close, as required. The switch 29 can be used to close the circuit between the energy harvester 30 and the DC/DC convertor 38, and thereby send the output of the energy harvester 30 to the DC/DC converter 38 or selectively divert the energy from the energy harvester 30 to ground (that is, a circuit ground node, which may be but need not be at Earth potential) when the bucket 28 is full or the battery level is such that re-charging is not required or otherwise indicated. Although shown between the energy harvester 30 and the DC/DC converter 38, the switch 29, or another switch, can also be located between the DC/DC converter 38 and the bucket 28, so as to selectively divert energy from the DC/DC converter 28 to ground. Energy sent to ground can be dissipated as heat. The switch 29 may be any switching electronic component, such as a transistor.

Due to the passing of the power through the DC/DC converter 38, some of the power may be lost, which can be seen as a loss in efficiency between the energy harvester 38 and the bucket 28. This efficiency lost may be monitored by one of the sensors 27 and the processor 26 to maintain accurate accounts of the power being supplied to the bucket 28 to determine when the bucket is full. Although it may be desirable to dump the bucket 28 when the bucket is full, in one embodiment in which the battery 22 requires power, the power stored in the bucket 28 may be transmitted even if the bucket is not full. This partial bucket, or the power supplied by the partial bucket, may be sensed by the processor 26 via the sensors 27.

If the battery 22 is fully charged, the processor 26 can transmit a signal to the switch 29 to open the switch or to connect the energy harvester 30 to ground in order to drain the power in the energy harvester 30. When it is further sensed that there is a need to provide power to the battery 22 (or if there are other conditions that indicate an elevated demand for power), the processor 26 may transmit a signal to the switch 29 to close and reconnect the energy harvester 30 with the DC/DC converter 38 so that the power can be transmitted and the bucket 28 filled.

The relationship between the amount of energy stored in one bucket and the number of buckets required for a fully charged battery and the relationship between a bucket and existing battery estimating units of measure, such as a coulomb, is stored in a database within the processor 26 to assist in the determination of battery power level. By referring to this information, the processor 26 can track the number of buckets of power remaining in the battery to provide a more accurate representation of the power level of a battery to a user via the display screen 14. In other words, the processor can more accurately account for the energy stored by monitoring the secondary power source (i.e. the energy harvester 30) and by monitoring the number of buckets of energy dumped into the battery.

In operation, the processor 26 determines the remaining power level of the battery via the sensors 27, which may be located throughout the device 10, by monitoring when the battery 20 is being charged via the external cord 34 and determining the number of buckets of power being transmitted to the battery 20, monitoring the amount of power being drained from the battery to provide power to the device components 38 and determining the amount of power being delivered in terms of buckets and monitoring the number of buckets of power being supplied by the bucket 28.

Figure 4:
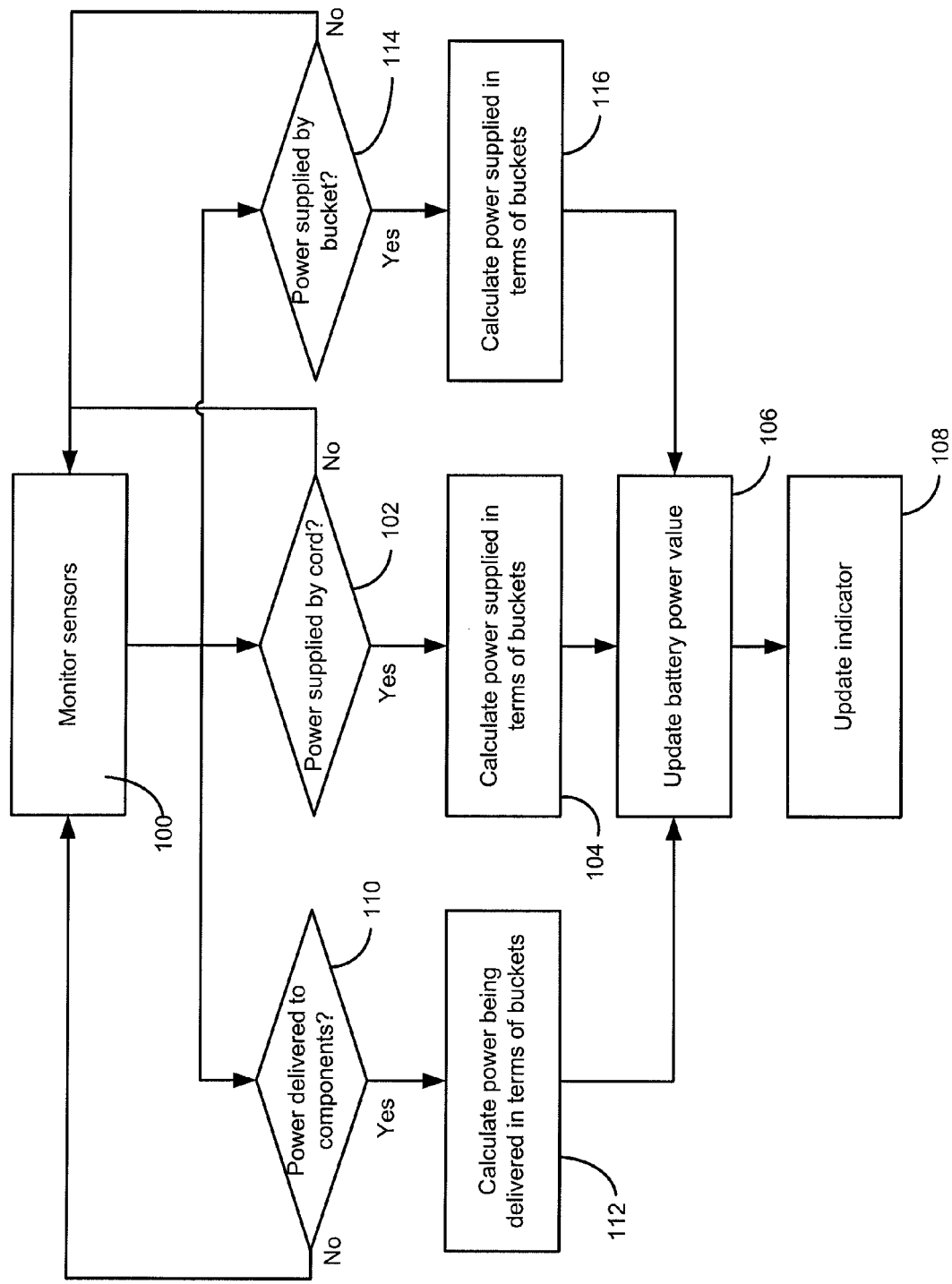
FIG. 4 is a flowchart outlining a method of battery life estimation.

A simple calculation of this can be seen as:

Battery percentage remaining=Old battery percentage−Power out+(# of buckets)(power/bucket)+Power from cord By converting the power out value and the (# of buckets) (power/bucket) to a common unit, a calculation can be performed to determine the power level of the battery or battery percentage remaining. It is assumed that the power from the cord can also be expressed by this common unit In the following example, and as illustrated by FIG. 4, it will be expected that the processor 26 has a relatively good estimate of the current power level remaining in the battery. Assuming that a linearly-sloped battery holds 5 V and a bucket is 0.05 volts, a full battery may be visualized or represented as the equivalent to 100 buckets. This will also depend on the charge or discharge curve of the battery 22. As batteries do not typically charge linearly with respect to voltage, there is provided a method of determining the state of charge or power level within a battery.

In operation, the processor 26 monitors 100 the sensors 27 to determine if any power is being transmitted to or delivered from the battery 22. This monitoring is continuously performed (that is, performed all the time or at frequent intervals) in order to continually retrieve information relating to the power level of the battery. Alternatively, the monitoring can be executed from time to time, e.g., on a predetermined schedule.

A check 102 is performed to determine if power is being supplied to the battery from an external cord (e.g., to determine if the battery is being charged via the cord). This may be achieved by monitoring the sensors at an output of the battery. If there is power being supplied, the processor calculates 104 the power being supplied (e.g., in terms of buckets or the common unit of measure) and then updates 106 the value of power remaining in the battery, which in one embodiment is stored as a parameter in the processor, or a database. Updating the value of power 106 can include calculating or computing, as a function of the energy (or power) transferred to the battery from the bucket, and as a function of the energy (or power) delivered by the battery to one or more power-consuming components, the approximate energy or power remaining in the battery.

The processor can update 108 the battery life estimation indicator on the display 14 based on the value in the parameter. The indicator on the display 14 may be rendered or re-rendered or modified on the display 14 to show the estimated battery life to a user.

In parallel with, or subsequent to, the check 102, a further check 110 may be performed to determine if power is being delivered by the battery to power device components. This may be achieved by monitoring the sensors at an output of the battery. If there is power being delivered or supplied to the device components, the processor calculates 112 the power being delivered (e.g., in terms of buckets or a common unit of measure) and then updates 106 the value of power remaining in the battery, which in one embodiment is stored as a parameter in the processor, or a database. The processor can then transmit a signal to update 108 the battery life estimation indicator on the display 14 based on the value in the parameter.

In parallel with the checks 102 and 110, or in some order, a check 114 is performed to determine if power is being supplied to the battery via the bucket (e.g., determine if the battery is being charged via the bucket). If there is power being supplied to the battery from the bucket, the processor calculates 116 the power being supplied (e.g., in terms of buckets or a common unit of measure) and then updates 106 the value of power remaining in the battery, which in one embodiment is stored as a parameter in the processor, or a database. The processor can then transmit a signal to update 108 the battery life estimation indicator on the display based on the value in the parameter and store this value in memory.

As a sample calculation, assume that the bucket is embodied as a capacitor with a capacitance value of 1 F. Knowing that 1 coulomb (C)=1 F*1V, every time the capacitor charges to 1V and "dumps" this voltage into the battery, 1 C is being supplied. Therefore, since the amount of power being delivered by the battery to the device components and being provided to the battery via the external cord can be calculated or sensed (e.g., in terms of coulombs), the power level remaining in the battery can be more accurately calculated as there is a common unit of measure. In an alternative embodiment, the bucket can be designed to provide energy starting from or between a specific voltage output so that an exact amount of power being provided by the bucket is known.

In another embodiment, the bucket may be selected, and its level of fullness selected, such that the "bucket of power" or "bucketful of energy" can be known and can be the common unit for power calculation. In other words, an amount of energy stored in a full bucket can be defined as a function of the energy storage capacity of the bucket, and this amount of energy may be defined as a unit of measurement. This unit of measurement may be used as, for example, a unit of measurement of the energy transferred to the battery from the bucket, a unit of measurement of the energy delivered from the battery to device components, and as a unit of measurement of the energy that reflects battery life. In this way, calculations with respect to remaining battery life can be a function of the unit of measurement.

As each of the measurements is calculated with respect to buckets, a more accurate indication of the remaining power level is provided. In an alternative embodiment, the processor may not need to update the power level remaining in the battery with every bucket of power being provided to the battery. The processor may, for example, update after a particular number of buckets have been provided. Such an optional restriction to updating may reduce power usage by the bucket system and may result in more useful and accurate indications of battery life.

During operation of the device, the device can be shaken, and the piezoelectric element(s) independently generate power which is then subsequently stored in the bucket. The processor can monitor the storage via the sensors.

When the bucket is full, it can then be transmitted to the battery in order to increase the power level stored within the battery by a specific amount dependent on the charge or discharge curve of the battery. As will be understood, a unit of energy added at one point on the curve may not result in the same voltage increase as another; the processor may account for the charge or discharge curve of the battery (which may be the curve of a kind of battery or the curve of a particular battery) and may control dumping of the bucket to aim for a target voltage.

In yet a further alternative embodiment, the dumping of the bucket can be controlled by the processor (e.g., to aim for a target voltage), or the bucket can be automatically dumped once the bucket is full, if the battery is able to receive the contents of the bucket (it may be possible to estimate whether the battery level is below a threshold value, which may mean that the battery is able to receive the contents of the bucket). It is also possible that if the bucket is a "large bucket" (e.g., a capacitor having a large capacitance or capable of receiving a significantly higher voltage than that stored by the battery), a less-than-full bucket may be dumped, and a proportion or percentage of a bucket can be delivered and tracked by the processor 116. In a conventional system that counts coulombs and that uses an unmonitored harvesting system, the estimation of battery life may be off by about 10% (and perhaps more when the battery power level is low). The user may not recognize the need to have the battery recharged (which may be undesirable, such as in an emergency situation in which access to a fully functional phone—a function that may have a power demand—may be important). Various embodiments described above may offer greater accuracy, including greater accuracy when the battery power level is low.

In another embodiment, for partial bucket dumps in which a less-than-full bucket of power is provided to the battery, other methods for calculating the power supplied to the battery 22 can be used. For instance, the volume and temperature of the bucket can be measured or sensed to determine the percentage of power remaining in the bucket along with a partial bucket counter to express the percentage as a fractional portion of a full bucket. Temperature, which can be sensed via a temperature sensor, may affect the storage of some buckets. The amount of power in the partially full bucket can be assumed to be a percentage of the full bucket. In both of these scenarios, the capacity and fullness of the bucket may be selected or otherwise known beforehand.

Also, another method of calculating a partial bucket is to assume a certain percentage of a full bucket if the capacitance of the bucket is low enough to not introduce error. This may be dependent on the size of the battery being charged and the power rate of the energy harvesting system. For example, when charging a headset battery (at 5 Whr), there is less concern about energy being supplied in 1 mWhr quantities. In this scenario, the capacitance of the bucket would be 1.1 F when discharging from 4.2V to 3.3V.

In the preceding description, for purposes of explanation, numerous details are set forth in order to provide a thorough understanding of the embodiments of the disclosure. However, it will be apparent to one skilled in the art that these specific details are not required in order to practice the disclosure. In other instances, well-known electrical structures and circuits are shown in block diagram form in order not to obscure the disclosure. For example, specific details are not provided as to whether the embodiments of the disclosure described herein are implemented as a software routine, hardware circuit, firmware, or a combination thereof.

The above-described embodiments of the disclosure are intended to be examples only. Alterations, modifications and variations can be effected to the particular embodiments by those of skill in the art without departing from the scope of the disclosure, which is defined solely by the claims appended hereto.

What is claimed is:

1. An apparatus for battery charge level estimation comprising:
    an energy harvester configured to convert non-electrical energy into electrical energy;
    an energy storage apparatus, electrically connected to the energy harvester and configured to store received energy from the energy harvester;
    a battery electrically connected to the energy storage apparatus such that the energy storage apparatus transfers the received energy to the battery;
    wherein the energy storage apparatus is configured to transfer the received energy to the battery by dumping the received energy stored in the energy storage device when the stored received energy reaches a threshold, an amount of energy transferred by the energy storage device to the battery during dumping being a known quantity;
    a counter configured to monitor a number of times that the energy storage apparatus dumps the received energy to the battery; and
    a processor configured to monitor the energy transferred from the energy storage apparatus to the battery and to monitor the energy delivered by the battery to a power-consuming component;
    wherein the processor is configured to determine a remaining life of the battery as a function of the energy transferred from the energy storage apparatus to the battery, the battery charge level of the battery, and the energy delivered by the battery to the power-consuming component; and
    wherein the processor is configured to determine the battery charge level of the battery based on the number of times that the energy storage apparatus dumps the amount of energy to the battery and a charge remaining in the battery prior to the energy storage apparatus dumping the received energy to the battery.

2. The apparatus of claim 1, wherein the amount of energy that the energy storage apparatus transfers to the battery during a dump provides a unit of measurement for determining the battery charge level and the determination of the battery charge level of the battery is a function of energy remaining in the battery expressed in the unit of measurement.

3. The apparatus of claim 1, wherein the energy harvester is at least one piezoelectric element.

4. The apparatus of claim 1, wherein the energy storage apparatus comprises a capacitor.

5. The apparatus of claim 1, further comprising a DC/DC converter electrically connected to the energy harvester and the energy storage apparatus, the converter configured to regulate the power from the energy harvester.

6. The apparatus of claim 5, further comprising a switch electrically connected to the energy harvester and the DC/DC converter, the switch configured to selectively divert energy from the energy harvester to a ground node.

7. The apparatus of claim 5 further comprising a switch electrically connected to the DC/DC converter and the energy storage apparatus, the switch configured to selectively divert energy from the DC/DC converter to a ground node.

8. The apparatus of claim 1, wherein the threshold is a voltage level.

9. The apparatus of claim 1, wherein the threshold corresponds to the energy storage apparatus having a full charge.

10. A method of determining a charge level of a battery comprising:
   counting, by a counter, a number of times that an energy storage apparatus transfers to a battery received energy that is stored in the energy storage apparatus, wherein the energy storage apparatus is configured to transfer the received energy to the battery by dumping the received energy stored in the energy storage apparatus when the stored received energy reaches a threshold, an amount of energy transferred by the energy storage apparatus to the battery during dumping being a known quantity;
   estimating, by a processor configured to monitor the energy transferred from the energy storage apparatus to the battery and to monitor the energy delivered by the battery to a power-consuming component, a remaining life of the battery by;
   determining, by the processor, energy transferred from the energy storage apparatus to the battery based on the counted number of times that the energy storage apparatus transfers the received energy to the battery and the amount of energy transferred by the energy storage apparatus during dumping;
   determining, by the processor, energy delivered by the battery to the power-consuming component; and
   determining, by the processor, the charge level as a function of the energy transferred and the energy delivered.

11. The method of claim 10 wherein determining energy transferred further comprises:
   determining, by the processor, power being supplied to the battery by an external power source.

12. The method of claim 10 wherein determining energy delivered by the battery comprises:
   monitoring, by the processor, sensors at an output of the battery.

13. The method of claim 12 wherein determining energy delivered further comprises:
   determining, by the processor, power being delivered by the battery.

14. The method of claim 10, wherein the threshold is a voltage threshold.

15. The method of claim 10, wherein the threshold corresponds to the energy storage apparatus having a full charge.

* * * * *